United States Patent [19]

Hayakawa et al.

[11] Patent Number: 4,812,620
[45] Date of Patent: Mar. 14, 1989

[54] CONCENTRATED RADIANT ENERGY HEAT SOURCE UNIT

[75] Inventors: Futomi Hayakawa; Kazuo Onoda, both of Tokyo, Japan

[73] Assignee: Hy-Bec Corporation, Tokyo, Japan

[21] Appl. No.: 860,789

[22] Filed: May 8, 1986

[30] Foreign Application Priority Data

May 8, 1985 [JP] Japan ............................ 60-66863[U]

[51] Int. Cl.⁴ .................. H05K 31/00; H01J 35/00; B23K 1/04; H05B 3/00
[52] U.S. Cl. ............................. 219/347; 219/85 BA; 219/343; 219/354
[58] Field of Search .............................. 219/347–349, 219/354, 343, 377, 85 BA, 85 BM

[56] References Cited

U.S. PATENT DOCUMENTS

| 2,951,928 | 9/1960 | Gialanella | 219/347 |
|---|---|---|---|
| 3,240,915 | 3/1966 | Carter et al. | 219/347 X |
| 3,247,383 | 4/1966 | Ulseth et al. | 219/347 X |
| 3,472,721 | 10/1969 | Abramson et al. | 219/343 X |
| 3,588,425 | 6/1971 | Erickson | 219/347 X |
| 3,654,471 | 4/1972 | Nilsson | 219/343 |
| 3,674,975 | 7/1972 | Nugent et al. | |
| 3,794,522 | 2/1974 | Mueller et al. | 219/354 |
| 3,862,397 | 1/1975 | Anderson et al. | 219/343 X |
| 3,879,164 | 4/1975 | Haldopoulos et al. | 219/354 X |
| 3,966,308 | 6/1976 | Nilson | 219/347 X |
| 4,101,759 | 7/1978 | Anthony et al. | 219/343 |
| 4,251,305 | 2/1981 | Becker et al. | |

FOREIGN PATENT DOCUMENTS

| 0184943 | 6/1986 | European Pat. Off. |
| 2024852 | 9/1970 | France |
| 2098535 | 3/1972 | France |
| 1234846 | 6/1971 | United Kingdom |

*Primary Examiner*—Anthony Bartis
*Attorney, Agent, or Firm*—Young & Thompson

[57] ABSTRACT

A heat source unit for concentrating radiant rays from a heat source lamp onto the processing site of the material to be processed by, for example, soldering, so as to bring this site to a requisite high temperature, comprises a mirror assembly composed of a pair of symmetrical half bodies, which have each an arcuate reflecting surface and together form a concave mirror. A pair of reflective side plates are mounted detachably on the opposite sides of the mirror assembly. The mirror assembly has cooling channels permitting circulation of cooling water therethrough. A heat resistant and light-transmissive shield plate is disposed over an irradiation opening of the unit and is supported by and between a pair of adjustable masking elements at opposite ends of the mirror assembly thereby defining a heat outlet opening of adjustable width. Housing shells are fixed detachably on each of the side plates. Pipe connections are provided for connecting the cooling channels and for feeding and discharging cooling water. A heat source lamp is supported in front of the mirror and behind the shield plate and between the side plates and is connected electrically to an electric power source.

2 Claims, 4 Drawing Sheets

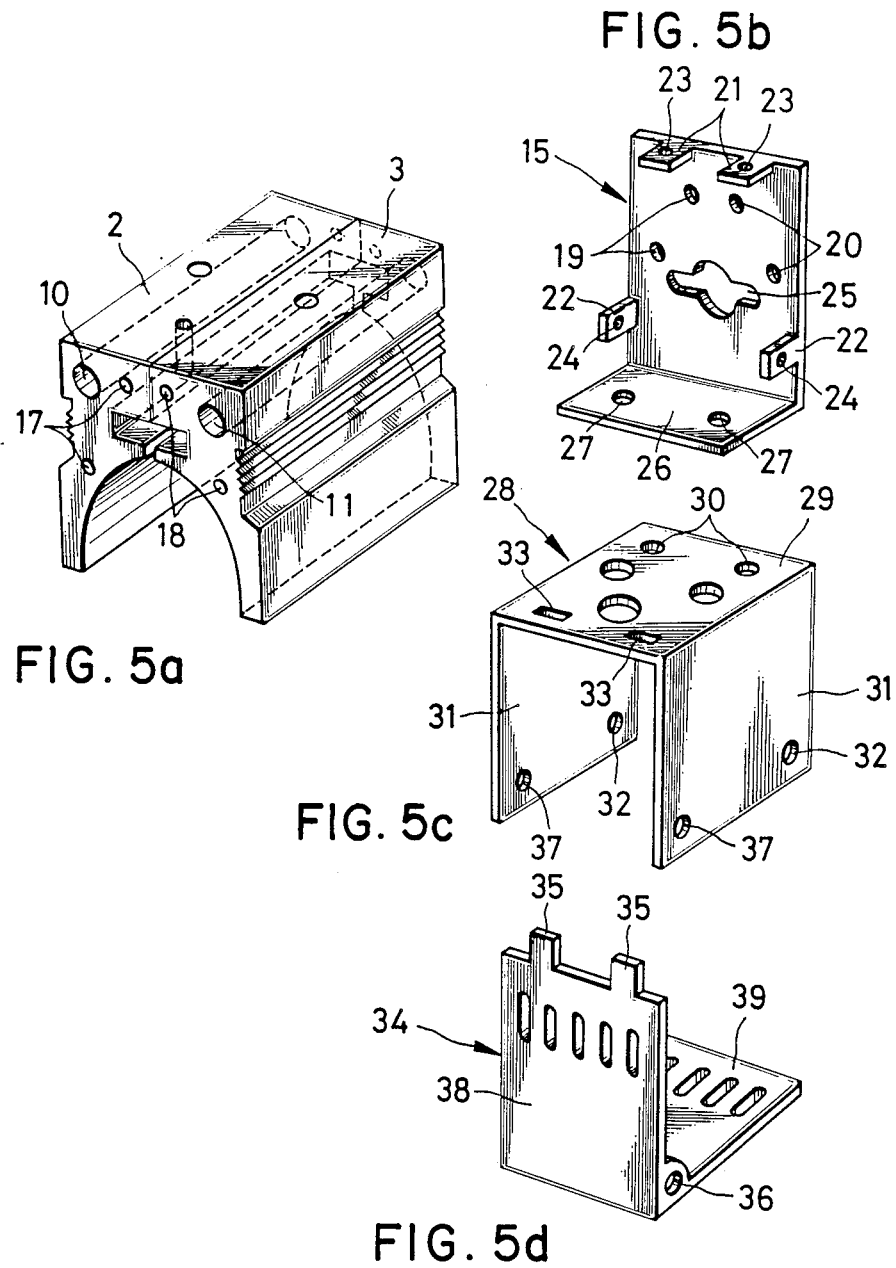

CONCENTRATED RADIANT ENERGY HEAT SOURCE UNIT

BACKGROUND OF THE INVENTION

The present invention relates to a non-contact type processing apparatus and, in particular, to a heat source unit having a quite simple construction for, e.g. soldering an IC-chip on a printed circuit board and other high temperature processing of materials.

For soldering of IC-chips on a printed circuit board, for example, there has been used apparatus which employs laser beams or which employs electric soldering irons. However, the former not only necessitates an expensive optical system but also has the disadvantage of markedly low productivity due to the need to ensure spot irradiation by the laser beam onto each restricted requisite point of soldering. The latter has the shortcoming that it often produces an inadequate connection at the processed site caused by the flux, or contaminants adhering to the soldering iron tip, etc., so that it is necessary to remove the contaminants and to polish the soldering iron tip at frequent intervals. In particular, it has been necessary to change or replace the soldering iron tip in accordance with changes in the type and form of the IC-chip to be soldered, which is quite uneconomical.

OBJECTS OF THE INVENTION

An object of the present invention is to provide a heat source unit for a processing apparatus, such as for soldering, in which a bundle of high energy heat rays is caused to irradiate concentratedly onto the site to be soldered, to achieve efficiently a reliable electric connection while completely avoiding the occurrence of any inadequate connection.

Another object of the present invention is to provide a heat source unit for a processing apparatus in which the entire construction of the unit is made compact and convenient for handling.

BRIEF SUMMARY OF THE INVENTION

The above and other objects of the invention are achieved according to the invention by the provision of a heat source unit for concentrating radiant rays from a heat source lamp onto the processing site of the material to be processed, in order to bring this site to a requisite high temperature. This heat source unit comprises a mirror assembly composed of a pair of symmetrical half bodies, which have each an arcuate reflecting surface and are combined together to form/an integrated concave mirror, and a pair of reflective end plates mounted each detachably on the both ends of the mirror assembly, the mirror assembly having cooling channels permitting circulation of cooling water; a heat resistant and light-transmissive shield plate disposed over the irradiation opening of the unit; housing shells each fixed detachably on either of said end plates; pipe connections for connecting said cooling channels and for feeding and discharging the cooling water; a heat source lamp supported in front of the mirror; and means for connecting the heat source lamp electrically to an electric power source.

BRIEF DESCRIPTION OF THE DRAWINGS

FIG. 5a is a perspective view of the two mirror half bodies;

FIG. 5b is a perspective view of a reflective end plate;

FIG. 5c is a perspective view of a chassis;

FIG. 5d is a perspective view of a closure plate;

DETAILED DESCRIPTION OF PREFERRED EMBODIMENT

In the following, the present invention is described in detail in connection with one embodiment thereof with reference to the appended drawings, as to which it is to be emphasized that the invention is not to be considered as being restricted only to the specific example described.

Figure 1:
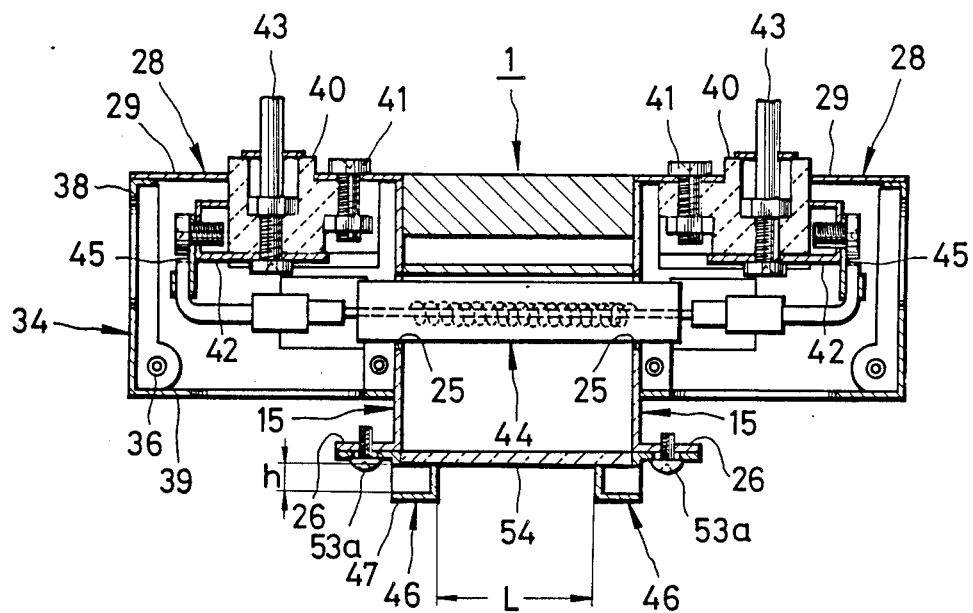
FIG. 1 shows an embodiment of the heat source unit according to the present invention in a vertical section.
Figure 2:
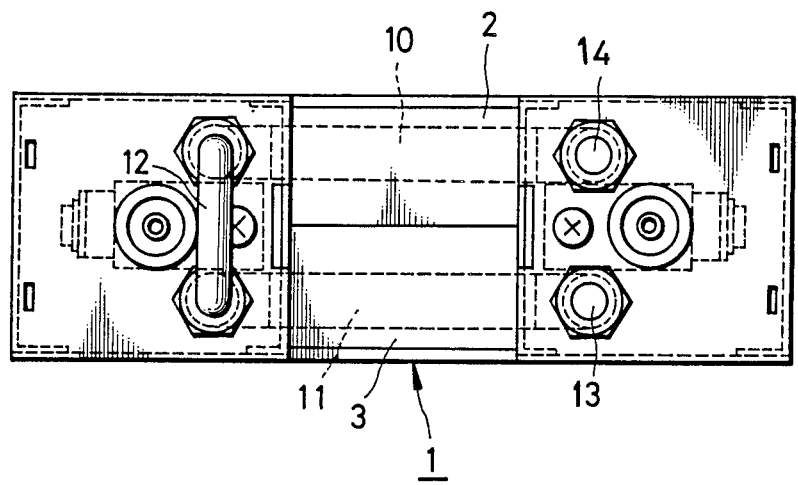
FIG. 2 is a plan view of the heat source unit of FIG. 1.
Figure 4:
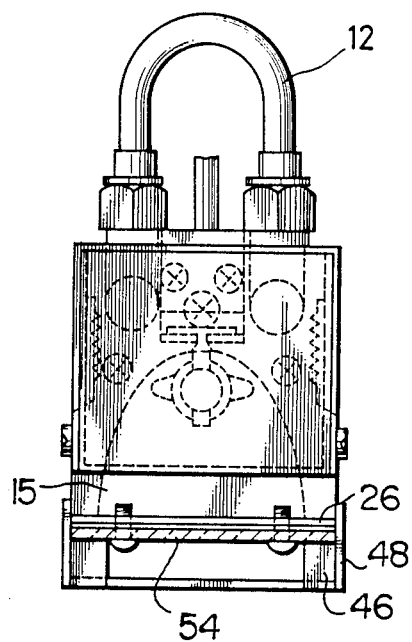
FIG. 4 is a side view of the heat source unit of FIG. 1.
Figure 3:
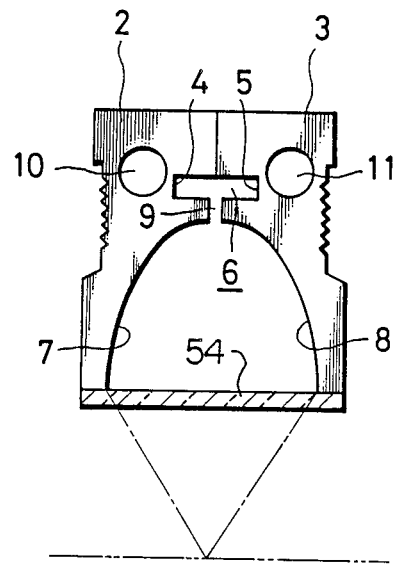
FIG. 3 is a side view of the mirror assembly employed in the heat source unit of FIG. 1.

The heat source unit 1 illustrated in FIGS. 1 and 2 includes a pair of symmetrical mirror half bodies 2, 3 combined together to form a mirror assembly (see FIG. 3). Each of the mirror half bodies 2, 3 has in its adjoining face a recess 4, 5 so as to form, when assembled, a rectangular cavity 6. The cavity 6 communicates through a connection pipe (not shown) to, for example, an air source. The two half bodies 2, 3 of the mirror assembly are provided each with a reflecting surface 7, 8 which continues to the cavity 6 via a throat 9. Into the cavity 6 is fed, if necessary, a compressed gas, such as, air, nitrogen or other gas, through the connection pipe. The compressed gas introduced is supplied through the throat 9 onto the reflection surfaces 7, 8, whereby a cleaning of the reflection surfaces is effected and any contamination of the reflecting surface during the soldering operation is prevented. Beside the cavity 6 of the mirror assembly, cooling channels 10, 11 are disposed which are connected together at one end by a connection pipe 12 and communicate with a feed pipe 13 and a discharge pipe 14 respectively. Cooling water is supplied from the feed pipe 13 and flows via the cooling channel 11, connection pipe 12 and cooling channel 10 into the discharge pipe 14.

Both ends of the mirror assembly composed of the half bodies 2, 3 are fitted each detachably with a reflective end plate 15, 15 (FIG. 5b) of the same configuration. Each of the reflective end plates 15 is fitted onto the corresponding end face of the mirror assembly in such a manner that fitting holes 17, 18 in the end faces of the mirror assembly are aligned with fitting holes 19, 20 through the reflective end plates 15 and plates 15 are fixed detachably to each other by fitting screws. Each reflective end plate 15 is provided integrally at its upper as well as both side edges with fitting lugs 21, 22 (see FIG. 5b). The fitting lugs 21, 22 have each a fitting hole 23, 24 therethrough. At nearly the center of each reflective end plate, there is provided a lamp insertion hole 25 in the form of a circle having diametral projections. The reflective end plate 15 has at its lower end a support flange 26 formed integrally by bending at a right angle and provided with a pair of fixing holes 27.

On the fitting lugs 21 of each of the end plates is supported a chassis 28 (FIG. 5c) having bent down side walls 31 and an upper bridging plate 29 that rests on the fitting lugs 21. Each upper bridging plate 29 is provided with fitting holes 30 which are aligned with the fitting holes 23, 23 and the chassis is fixed detachably to the end plate 15 using fitting screws inserted in the aligned fitting holes. On the other hand, fitting holes 32, 32 formed on each of the side walls 31, 31 of the chassis are aligned with the fitting holes 24, 24 of the fitting lugs 22 and the two are fixed together detachably by fitting screws inserted therein.

Each upper bridging plate 29 is provided with slots 33, 33 and each chassis 28 is fitted with a closure plate 34 (FIG. 5d) shaped in a form of angle, so as to form a respective housing shell, by inserting two projections 35, 35 disposed on the upper edge of the closure plate into said slots 33, 33 of the upper bridging plate 29 while aligning fitting holes 36 provided at the corner portion of the closure plate 34 with fitting holes 37, 37 formed in the chassis 28 and fixing by fitting screws inserted therein. The web portion 38 (vertical side) of the closure plate 34 closes the side opening of the chassis 28 and the flange portion 39 (horizontal side) thereof closes the bottom of the chassis 28.

An insulator 40, 40 is disposed on each of the upper bridging plates 29 of the chassis 28 by a fixing screw 41. An electric terminal member 42 disposed on the insulator 40 is connected detachably to an electric conductor 43, on the one hand, and is connected with a junction terminal 45 connecting to the heat source lamp 44, on the other hand. The heat source lamp 44 is supported at its ends in the insertion holes 25 formed in both the reflective end plates 15, 15.

Figure 6:
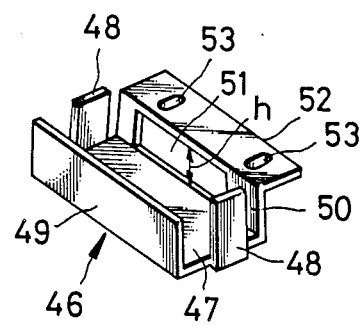
FIG. 6 shows the masking element used in the heat source unit of FIG. 1 in a perspective view.

On each support flange 26, 26 disposed at the lower end of each of the reflective end plates 15, 15, a masking element 46, 46 (FIGS. 6 and 7) is fixed detachably by tightening fixing screws inserted in the fixing holes 27. The masking element 46 has a flat bottom plate 47 and upright legs 48, 48 at both ends of the bottom plate 47 formed integrally opposite each other. On both sides of the bottom plate 47, there are formed integrally therewith two upright shielding walls 49, 50 opposite each other. The shielding wall 50 has a fitting flange 52 formed integrally therewith and a window 51. The fitting flange 52 has two long holes 53 so as to enable securing the masking element to the support flange 26 with adjustment of the distance between the pair of masking elements, by tightening adjusting screws 53a, 53a inserted in the long holes 53 and screwed in the support flange 26.

The irradiation opening of the heat source unit is shielded by a transparent shield plate 54 (FIG. 1) which is supported by the pair of masking elements 46. The shield plate 54 is made of a heat resistant and light-transmissive material, such as quartz glass, Pyrex (trade name) and so on. The masking width "L" may be chosen as desired by selecting the length of the long holes 53. The part of the irradiated light scattered and thus having low radiation intensity is shaded by the masking elements 46 and is diverted from the requisite masking width "L" by selecting an adequate height "h" of the window 51, whereby heat rays having the highest energy are concentrated within the masking width "L", and thus a bundle of heat rays having sharp contour can be obtained.

Figure 7:
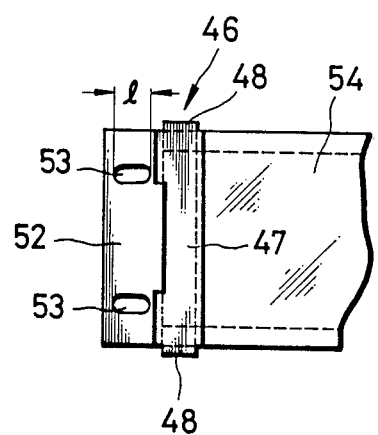
FIG. 7 shows the manner of assemblage of the masking element in plan view.
Figure 8:
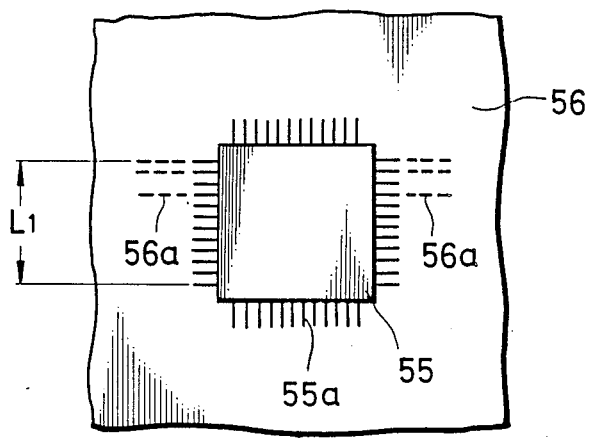
FIG. 8 is an explanatory plan view of an IC-chip placed on a printed circuit board for soldering.
Figure 9:
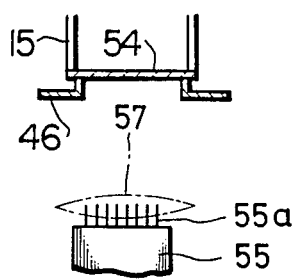
FIGS. 9 and 10 depict schematically the manner of formation of the radiation spot of varying length.
Figure 10:
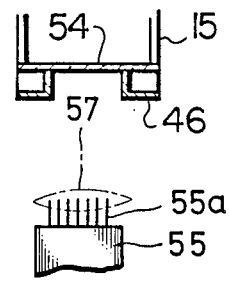

There will now be described the particular soldering procedures for a flat square IC-chip 55 on a printed circuit board 56 (FIG. 8). The IC-chip 55 shown in FIG. 8 has a row of terminals 55a on each side edge. For each row of terminals of the IC-chip, there is arranged in opposition thereto a row of lead line terminals 56a on the printed circuit board. Each corresponding pair of terminals 55a and 56a is connected by soldering using the irradiation heat rays from the heat source unit according to the present invention. Especial care must be exercised so that the heat rays will be restricted to the processing range, namely the range defined by the width "$L_1$" in FIG. 8, and not be directed to the other portions. For this purpose, a masking width "L" corresponding to the processing range "$L_1$" is set by adjusting the width between the masking elements 46, 48. To do this, the adjusting screws 53a are loosened and the masking elements 56, 56 are shifted relative to each other to set a suitable masking width. When soldering a linear spot having a length "$L_1$" of, for example, 24 mm, the masking width "L" is adjusted so as to obtain a heat ray bundle with a profile length of 24 mm by shifting the masking elements 46, 46 relative to each other, as shown in FIG. 7. If the length of soldering spot "$L_1$" amounts to, for example, 20 mm, the masking elements 46, 46 are shifted in the same manner so as to obtain a heat ray bundle 57 having a profile length of 20 mm, as shown in FIG. 10. After the masking width has been adjusted in accordance with the length of the soldering spot as explained above, cooling water is fed from the feed pipe 13. The cooling water flows through the cooling channel 11 and the connection pipe 12 into the cooling channel 10 and is exhausted from the discharge pipe 14 to attain circulation. The material 55, 56 to be processed is positioned at a predetermined processing position. By switching on the electric power source, the heat source lamp 44 is lit up and irradiates heat rays within a predetermined range as explained above and the soldering sites are soldered in an instant.

The heat source unit according to the present invention permits an efficient irradiation of processing sites of various forms with a high energy heat ray bundle with a correspondingly selected masking width, so that there is no undesirable effect on the portions other than the site to be processed, while avoiding any inadequate connection. Moreover, the unit is constructed quite compactly in its entire arrangement and offers an easy handling and convenient maintenance, inspection and replacement of parts due to the possibility of disassembly of every constituent element.

What is claimed is:

1. A heat source unit for concentrating radiant rays from a heat source lamp onto a processing site of material to be processed, so as to bring this site to a high temperature, comprising a mirror assembly composed of a pair of symmetrical half bodies, each of which has an arcuate reflecting surface, said bodies together forming a concave mirror;

a pair of reflective end plates mounted detachably on the opposite ends of the mirror assembly;

a pair of masking elements disposed at opposite ends of the mirror assembly, means adjustably interconnecting each masking element with an adjacent said end plate for adjustably supporting the masking elements on the end plates in any of a plurality of positions in which said masking elements are spaced more or less close to each other and overlie a portion of said reflecting surface thereby to define a heat outlet opening of adjustable width;
a heat source lamp supported in front of the mirror and between said end plates; and
means for connecting the heat lamp electrically to an electrical power source to emit radiant heat between said masking elements.

2. A heat source unit as claimed in claim 1, and a heat resistant and light transmissive shield plate supported by and between said masking elements.

* * * * *